United States Patent [19]  [11] 3,984,582
Feder et al.  [45] Oct. 5, 1976

[54] METHOD FOR PREPARING POSITIVE RESIST IMAGE

[75] Inventors: Ralph Feder, Hyde Park; Ivan Haller, Chappaqua; Michael Hatzakis, Ossining; Lubomyr T. Romankiw, Briarcliff Manor; Eberhard A. Spiller, Mount Kisco, all of N.Y.

[73] Assignee: IBM, Armonk, N.Y.

[22] Filed: June 30, 1975

[21] Appl. No.: 591,980

[52] U.S. Cl. ................................. 427/43; 427/273; 96/35.1
[51] Int. Cl.² ............................................ B05D 3/06
[58] Field of Search .............. 427/43, 273; 96/35.1, 96/36.2, 48 R

[56] References Cited
UNITED STATES PATENTS
3,104,175  9/1963  Marx et al. .......................... 427/273
3,799,777  3/1974  O'Keefe et al. ...................... 96/36.2

OTHER PUBLICATIONS

Kovaleva "Chem. Abstracts" 80, 9023u.

*Primary Examiner*—John H. Newsome
*Attorney, Agent, or Firm*—Pollock, Vande Sande & Priddy

[57] ABSTRACT

A positive resist image is produced by exposing, to radiation in a predetermined pattern, a polymeric material containing polymerized alkyl methacrylate units and polymerized monoethylenically unsaturated acid units. The exposed and unexposed areas are distinguished by their different respective abilities to be swelled in an appropriate swelling agent, and the swelled areas are removed by dispersal in a nonsolvent liquid.

29 Claims, No Drawings

METHOD FOR PREPARING POSITIVE RESIST IMAGE

BACKGROUND OF THE INVENTION

Prior art positive resist images, such as those useful in the fabrication of integrated circuits, printing plates and the like, are generally prepared by coating a film or layer of an appropriate material such as a polymeric material onto a substrate, and then exposing portions of the film or layer to radiation such as electron beam, ultraviolet light and x-ray radiation in a predetermined pattern of the desired geometry with sufficient exposure to degrade the polymeric material in the exposed areas. Next, the electron beam degraded polymeric material is removed from the exposed area with a solvent which has a marked differential solubility for the exposed degraded products and for the unexposed polymeric material.

The energy dosage and exposure time in such processes need to be sufficient to provide a large enough difference between the molecular weight of the exposed and unexposed polymer to make it possible to remove the exposed degraded material without also removing a large proportion of the unexposed areas by dissolution in the selected solvent.

It is desirable and important in the manufacturing of devices such as integrated circuits by electron beam lithography or by other means of radiation, that the energy dosage and exposure time required for high resolution be as low as possible to provide a process which is both practical and economical to carry out.

Accordingly, it is an object of the present invention to provide a process whereby it is possible to employ relatively low energy dosages and/or low exposure times. Another object of the present invention is to provide a process which does not require a marked differential solubility for the exposed and for the unexposed polymeric materials.

Another object of the present invention is to provide a process for forming a positive resist image by exposure to radiation such as electron beam radiation, x-ray, and ultraviolet light which employs a polymeric material of improved resist sensitivity and resolution.

Another object of the present invention is to provide a process for the formation of high resolution polymeric positive resists utilizing a radiation activated polymer of certain polymeric materials containing polymerized alkyl methacrylate units, which polymer exhibits excellent film-forming characteristics, resistance to various etch solutions, and ready removal of unexposed portions with simple solvents.

The use of certain alkyl methacrylate polymers as radiation degradable and particularly electron beam degradable polymers for the formation of resist masks which are useful in the fabrication of integrated circuits, printing plates, and the like has been proposed heretofore. For instance, U.S. Pat. No. 3,538,137 granted on Oct. 20, 1970 to Haller et al teaches among other things the use of methacrylate polymers containing a quaternary carbon in the polymer backbone such as polymethyl methacrylate, and copolymers of methyl methacrylate with 2-hydroxy ethyl methacrylate, for such purpose. In addition, U.S. Pat. No. 3,779,806, granted on Dec. 19, 1973 to Gipstein et al discloses the use of certain polymers of t-butyl methacrylate for such purpose.

Related discussions are contained in the articles "Polymethyl Methacrylate as an Electron Sensitive Resist" by R. A. Harris, J. Electrochemical Society, Vol. 120, No. 2, pp. 270–274, Feb. 1973, and "A Modified Methacrylate Positive Electron Resist" by E. D. Roberts, Applied Polymer Symposium, No. 23, pp. 87–98 (1974). For a discussion of employing polymethyl methacrylate in x-ray lithography, see "X-Ray Lithography - A New High Resolution Replication Process" by D. L. Spears et al, Solid State Technology, July 1972. pp. 21–26.

Also, certain modified alkyl methacrylate polymeric materials have been suggested by Gipstein et al for increasing the sensitivity to electron-beam radiation, IBM Technical Disclosure Bulletin, Vol. 16, No. 9, February 1974 - Sensitive Positive Electron Beamed Resists, and U.S. Pat. application Ser. No. 545,063 filed Jan. 29, 1975.

The use of polymethyl methacrylates suggested heretofore has apparently been limited to techniques in semiconductor processing which employs temperatures not exceeding about 130° C (see M. Hatzakis, Journal Electrochemical Society, 116, 1033, 1969). Accordingly, it is an object of the present invention to provide a process wherein the polymeric materials employed have increased thermostability as compared to polymethyl methacrylate homopolymers. It is an object of the present invention to be able to provide semiconductor processing such as sputter etching, ion-beam etching, ion-beam doping, or lift-off metallurgy techniques wherein the polymeric material can be subjected to relatively high temperatures, i.e., above about 135° C.

SUMMARY OF THE INVENTION

The present invention is concerned with a method for the production of a positive resist image comprising the steps of:

A. exposing a film of a polymeric material to radiation in a predetermined pattern, wherein the polymeric material is a polymeric material containing:
1. polymerized alkyl methacrylate units wherein the alkyl group contains 1 to 4 carbon atoms; and
2. polymerized units of a monoethylenically unsaturated acid selected from the group consisting of acrylic acid, methacrylic acid, crotonic acid, and mixtures thereof; and wherein the amount of the polymerized alkyl methacrylate unit (1) is from about 50 to about 99.5 mole % and the amount of the polymerized units of the monoethylenically unsaturated acid (2) is from about 50 to about 0.5 mole % based upon the total moles of (1) and (2) in the polymer material;

B. treating the polymeric film with a swelling agent to swell only the exposed portions; and C. then treating the polymeric film with a liquid which is incapable of molecularly dissolving the exposed or unexposed regions of the polymeric material for a time at least sufficient to remove the swollen exposed areas of the polymeric film.

DESCRIPTION OF PREFERRED EMBODIMENTS

The process of the present invention is particularly useful for fabricating any small geometry device such as semiconductor, integrated optics, bubble patterns and masks. The initial step in the process of the present invention is exposing the polymeric film to radiation such as electron beam radiation, x-rays or far UV light to delineate the necessary pattern required in the processing such as in integrated circuitry. It has been found in accordance with the present invention that the energy dosage and time of exposure according to the present invention, when using the polymeric materials as will be further defined hereinafter, need only be sufficient to distinguish the exposed and unexposed areas by their different respective abilities to be swelled in an appropriate swelling agent. This differs from the higher requirements of the energy dosages and exposure times of prior art processes which are sufficient to cause in the exposed areas substantial degradation of the polymeric material to lower molecular weight products capable of being dissolved in an appropriate solvent.

Accordingly, the process of the present invention makes it possible to employ relatively low dosages of the radiation. The specific exposure flux will normally be dependent upon the particular polymeric material selected within the scope of the present invention and upon the thicknesses of the polymeric resist. Generally for exposure of the polymeric material in the thicknesses of about 50 angstroms to about 10 microns, electron beam radiation from about $10^{-7}$ coulombs/cm$^2$ to about $10^{-4}$ coulombs/cm$^2$ and preferably from about $10^{-6}$ to about $10^{-5}$ coulombs/cm$^2$ and an accelerating potential in the range from about 1 Kv to about 1 Mev and preferably from about 5 to about 30 Kv are employed. Generally for exposure of the polymeric material in the thicknesses of about 50 angstroms to about 10 microns, x-ray radiation from about $5 \times 10^{-3}$ to $5 \times 10^{-2}$ joules/cm$^2$ and photon energy in the range from about 0.1 Kev to about 10 Kev are employed. Generally for exposure of the polymeric material in the thicknesses of about 50 angstroms to about 10 microns, ultraviolet light from about $5 \times 10^{-3}$ to $5 \times 10^{-2}$ joules/cm$^2$ and a photon energy of at least about 5 ev. and usually in the range from about 5 to about 20 ev. are employed.

In the fabrication of a small geometry device prior to the exposure step, the polymeric materials employed in the present invention are normally coated on a substrate from a solution of the polymeric material and in any manner such as by spin casting or dipping, and then dried to remove the volatile matter. The solution of the polymeric material should be compatible with the substrate. The solvents employed generally have a boiling point below the decomposition point of the polymeric material employed in order to permit removal of the solvent from the cast film by heating. Exemplary of some suitable solvents are Cellosolves such as ethyl Cellosolve acetate, methyl Cellosolve acetate, ethyl Cellosolve and methyl Cellosolve; and cyclic ketones such as cyclopentanone, cyclohexanone, and cycloheptanone; and acetic acid (The Cellosolves are trade mark named solvents and are 2-alkoxyethnols or 2-alkoxyethyl esters.) Also for polymeric materials having high content of polymerized units from ethylenically unsaturated acid, polar solvents such as water can be employed and particularly can be employed in admixture with the above-mentioned solvents. When employing mixtures of solvents it is preferred to use solvents which have similar evaporation rates. The determination of a specific solvent for a particular polymeric material primarily depends upon the molecular weight and relative amounts of the different polymerized units in the polymeric material and is readily ascertainable.

The polymeric films can be cast in various thicknesses and particularly from about 0.01 to about 20 microns. The particular thickness will depend upon the type of processing to be employed. For instance, about 0.5 to about 3 microns are generally desirable for etch processing and for lift-off metallurgical processing.

In addition, prior to the exposure, it is preferred to prebake the polymeric film in air or in a vacuum at a temperature generally above the glass transition temperature of the polymeric material but below the thermal temperature of the polymeric material but below the thermal decomposition temperature of the polymeric material. The prebaking step is intended to dry the polymeric material by removing trace amounts of the solvent employed in the coating step, and also to anneal out strains of the polymeric film. The film is generally prebaked at a temperature from about 140° to about 230° C and preferably from about 160° to about 220° C.

Various substrates can be employed as supports depending upon the particular device to be fabricated. For instance, in semiconductive devices, or integrated circuits, the substrate can comprise semiconductor wafers or chips overcoated with oxides and nitrides such as silicon oxide/silicon nitride for diffusion masks and passivation and/or metals normally employed in the metallization steps for forming contacts and conductor patterns on the semiconductor chip.

After exposure, the exposed portions of the polymeric film are removed by a multistage procedure. In the first stage of the development or removal process, the polymeric film is treated with a swelling agent to thereby swell only the exposed portions. The swelling agent is preferably a mixture of a solvent capable of dissolving the polymer regardless of the molecular weight of the polymer and a liquid which is incapable of dissolving the polymer regardless of the molecular weight of the polymer (nonsolvent) mixed in proportions sufficient to swell only the exposed portions. It is preferred to employ such mixtures since the mixture can readily be manipulated to accommodate large number of polymers by properly varying the relative amounts of the components in the mixture.

Exemplary of suitable solvents capable of dissolving the polymeric material regardless of the polymeric material's molecular weight include Cellosolves such as methyl Cellosive acetate, ethyl Cellosolve acetate, methyl Cellosolve, and ethyl Cellosolve; and cyclic ketones such as cyclopentanone, cyclohexanone, and cycloheptanone. The preferred solvents are ethyl Cellosolve acetate and cyclopentanone with ethyl Cellosolve acetate being the most preferred.

The determination of a specific solvent for a particular polymeric material primarily depends upon the chemical identity of the polymeric material and particularly the amount of polymerized units form the monoethylenically unsaturated carboxylic acid.

Exemplary of suitable nonsolvent liquids which are incapable of dissolving the polymer regardless of its molecular weight include aliphatic monohydric alcohols which generally contain from 1 to about 10 carbon atoms, and preferably contain from 2 to 4 carbon atoms.

Some preferred alcohols suitable for use in the present invention include methyl alcohol, ethyl alcohol, isopropyl alcohol, n-butyl alcohol, isobutyl alcohol, and hexyl alcohol. The preferred alcohols are ethyl alcohol and isopropyl alcohol with ethyl alcohol being the most preferred. These preferred nonsolvent liquids are generally capable of dissolving a homopolymer of the monoethylenically unsaturated acid employed in the polymeric material. The selection of a specific nonsolvent for a particular polymeric material primarily depends upon the chemical identity of the polymeric material and particularly the amount of polymerized units from the monoethylenically unsaturated carboxylic acid.

The preferred swelling agent is a mixture of ethyl Cellosolve acetate and ethyl alcohol. The components of the swelling agent are admixed with proportions sufficient to swell only the exposed portions of the polymeric material. The particular proportions employed will depend primarily upon the specific constituents of the swelling agent selected and upon the exact chemical identity of the polymeric material and molecular weight thereof. Generally the volume ratio of the solvent to the nonsolvent liquid is from about 1 to 1 to about 1 to 10 and preferably from about 1 to 2 to about 1 to 5.

The exposed portion of the polymeric film is treated with the swelling agent for a time sufficient to swell the film and allow the swelling agent to diffuse through the exposed areas. Generally, the developement time for this stage is between about 1 to about 90 minutes and preferably between about 3 to about 60 minutes. The exposed portions are treated with the swelling agent at temperatures in the range from about 10° C to about 60° C. The development time of this stage can be altered by such factors as the particular polymeric material employed, the thickness of the film, the particular swelling agent employed, and the particular temperature used for this development stage when carrying out this stage of the present invention, it is possible to visually observe the difference between the swollen and nonswollen regions of the polymeric film.

Next, the polymeric film is treated with the nonsolvent liquid for a time sufficient to remove the swollen exposed areas of the polymeric film. One particular manner in which the exposed portions can be treated with the nonsolvent is to immerse the sample being treated in a bath of the nonsolvent and agitate for a time sufficient to effect the removal of the swollen areas. For instance, the removal can be facilitated by subjecting the bath to ultrasonic agitation. Generally the removal can be effected when employing ultrasonic agitation in about 15 to about 90 seconds and preferably 15 to about 60 seconds. In addition, according to the magnitude of exposure, it is possible to remove the swollen areas by merely spraying the sample with the nonsolvent. The swollen material is usually removed as a dispersion in the nonsolvent and generally as dispersed particles of several hundred A in diameter (i.e., about 200 to about 700 A in diameter).

The polymeric material which is employed according to the present invention is a polymeric material which contains polymerized units of acrylic acid, methacrylic acid, crotonic acid, and mixtures thereof.

Exemplary of suitable alkyl methacrylate units in the polymeric material are methyl methacrylate and t-butyl methacrylate of which methyl methacrylate is preferred.

The preferred polymerized acid unit is polymerized methacrylic acid. Of course, mixtures of the monoethylenically unsaturated acids can be employed, if desired.

Generally the relative amount of the polymerized alkyl methacrylate units in the above polymeric material is from about 50 to about 99.5 mole % and the relative amount of the polymerized units from the monoethylenically unsaturated acid is from about 50 to about 0.5 mole % based upon the total moles of alkyl methacrylate units and the monoethylenically unsaturated acid units in the polymer.

Preferably, the polymeric material contains from about 95 to about 60 mole % of the polymerized alkyl methacrylate units based upon the total moles of the alkyl methacrylate and monoethylenically unsaturated acid units in the polymeric material.

Preferably, the polymeric material contains polymerized units of the monoethylenically unsaturated acid in amounts from about 5 to about 40 mole % based upon the total moles of the alkyl methacrylate and the monoethylenically unsaturated acid in the polymeric material. If desired, the polymeric material can contain minor amounts (i.e., up to about 10 mole %) of polymerized units of ethylenically unsaturated monomers other than those discussed above, so long as such do not adversely affect the radiation sensitivity of the polymeric material or form insoluble residues in the exposed polymer such as by cross-linking and so long as the total amount of the units of ethylenically unsaturated monomers other than the alkyl methacrylates is no greater than about 50 mole % of the polymeric material. However, it is preferred to employ copolymers which include only the alkyl methacrylate and the units of the ethylenically unsaturated acid.

Generally, the polymeric materials employed according to the present invention have a number average molecular weight (Mn) in the range of about $5\times10^3$ to about $2\times10^6$ and preferably in the range of about $10^5$ to about $10^6$.

One method for preparing copolymers employed in the present invention is by bulk polymerization employing a free radical initiator. Free radical catalysts or initiators of particular interest include azo catalysts such as azobisisobutyronitrile and peroxide catalysts.

The amount of catalyst employed depends upon the type of catalyst system used and is generally from about 0.01 to about 10 parts by weight per 100 parts of the polymerizable monomers, and preferably is from about 0.1 to about 1 part by weight per 100 parts of the polymerizable monomers.

The polymerization is generally carried out at temperatures between about room temperature and about 150° C, and preferably between about 50° C and about 100° C. Usually the polymerization is conducted under autogeneous pressure in a closed reaction vessel. However, any suitable means to prevent significant evaporation of any of the monomers can be employed. The molecular weight of the polymeric material can be regulated by including chain transfer agents such as n-butyl mercaptan. Desirably the polymerization is carried out to completion.

In addition, the polymers may be fractioned from solutions by addition of a nonsolvent in order to improve the uniformity of the polymeric material such as its molecular weight and/or composition.

It has been discovered according to the present invention that is not necessary to develop a marked solubility differential between the exposed and unexposed areas in order to successfully and selectively remove only the exposed materials which contain the above-defined quantities of the polymerized alkyl methacrylate units and polymerized units of the monoethylenically unsaturated acid.

The development does not depend on differential solubility rate between exposed and unexposed regions but depends upon the solvent diffusion through the exposed area. This makes it possible to employ very low exposure dosages to effect the product of the positive resist image. However, the low energy dosages and removal steps of the present invention have not been successful when employing prior art homopolymers of the alkyl methacrylate. Such homopolymers apparently require exposure to radiation to sufficiently degrade the exposed areas to provide marked differential solubility between the exposed and unexposed areas to be selectively removed. Also such homopolymers are apparently not sensitive enough to the relatively low energy dosages which can be employed in the present invention to be sufficiently effected by the exposure for the exposed and unexposed areas to be distinguishable by different respective abilities to be swelled in a swelling agent.

The pattern resist image can be postbaked to remove the developer liquids. Normally, the temperatures should be below the melting point or flow point of the polymeric film. Generally the temperature for postbaking is from about 100° to about 170° C depending upon the specific polymeric material employed. In contrast, when using prior art polymethyl methacrylate, only temperatures up to about 120° C should be employed. The increased thermostability achieved by the present invention is useful in lift-off metallurgical processing in which the metal is preferentially deposited at elevated temperatures.

In the lift-off process, the resist acts as a deposition mask for the metal overlay. If polymethyl methacrylate is employed as the resist, the substrates such as silicon wafer must be cooled to prevent heating the resist above temperatures of about 100° C. If the substrate temperature rises about 120° C, the resist film tends to collapse and the images will close shut.

The resist films can then be solvent stripped from the substrate following the etch, or the undesired metal can be lifted off in the so-called lift-off process. Suitable stripping solvents are the casting film solvents employed at elevated temperatures such as for example the cyclic ketones and Cellosolves, and cellosolve acetates.

The following nonlimiting examples are provided to further demonstrate the present invention.

EXAMPLE 1

About 5 parts by volume of a copolymer of about 99 mole % methyl methacrylate and about 1 mole % methacrylic acid are dissolved in 95 parts of ethyl Cellosolve acetate. The solution is heated to about 60°–70°C and ethyl alcohol is added while stirring until the solution becomes cloudy. The stirring is continued and the solution is then allowed to cool to room temperature. Precipitate is removed by filtering. The solvents are stripped from the solution by gentle heating to about 60°–70 °C. The residue from the solution is redissolved in ethyl Cellosolve acetate to form 5% by weight solutions of the polymer. Films of 5,000 A copolymer thicknesses are formed on a number of different silicon wafers by spin casting the 5% solutions at about 1,000 rpm. Also films of 10,000 A copolymer thickness are formed on a number of silicon wafers by spin casting the 5% solutions at about 500 rpm. The films are prebaked in air at about 160°C for about 1 hour in an oven. The films are then exposed in vacuum of about $5 \times 10^{-6}$ mm of Hg, to an electron beam of 1,000 A diameter patterned to produce lines of one micron and large areas of uniform exposure by use of a large mask in an optical flying spot scanner system. Exposures varying from $10^{-6}$ coulombs/cm$^2$ to $10^{-5}$ coulombs/cm$^2$ are made on several samples. The exposed samples are developed in 30 ml of a mixture containing two parts by volume of ethyl Cellosolve acetate per five parts by volume of ethyl alcohol. For exposures above $5 \times 10^{-6}$ coulombs/cm$^2$, soaking in the above developer mixture for 5 minutes or less, followed by spraying with ethyl alcohol is sufficient to develop a clean image in the resist layer without any loss of thickness in the unexposed regions of the resist. For exposures in the range of $10^{-6}$ coulombs/cm$^2$ coulombs/cm$^2$, soaking in the above developer mixture for at least 5 minutes, followed by ultrasonic agitation in at least about 2 ml of an ethyl alcohol bath for 30 seconds to 1 minute, is sufficient to develop a clean image without any unexposed resist thickness loss. This latter process is suitable even for $10^{-6}$ coulombs/cm$^2$ exposure and a minimum line width of 1 micron.

To examine the form in which the exposed polymer is removed, the dispersion obtained in the latter process was sprayed onto a collodion film, dried and shadowed with platinum. Transmission electron micrographs resembled those of polymer latexes, showing flattened particles much larger than molecular in size, ranging in diameters from about 200 to 700 Angstroms and in thickness from 40 to 100 A.

EXAMPLE 2

Example 1 is repeated except that the developer misture contains 2 parts by volume of cyclopentanone per 5 parts by volume of ethyl alcohol. The results obtained are similar to those of Example 1.

EXAMPLE 3

Example 1 is repeated except that the developer mixture contains 2 parts by volume of cyclopentanone per 5 parts by volume of isopropyl alcohol and isopropyl alcohol is employed in the ultrasonic bath. The results obtained are similar to those of Example 1.

EXAMPLE 4

Example 1 is repeated except that a copolymer of 97.5 mole % methyl methacrylate and 2.5 mole % methacrylic acid are employed. The results obtained are similar to those of Example 1.

EXAMPLE 5

Example 1 is repeated except that a copolymer of 90 mole % methyl methacrylate and 10 mole % methacrylic acid is employed. The results obtained are similar to those of Example 1.

EXAMPLE 6

About 5 parts of a copolymer of 90 mole % methyl methacrylate and 10 mole % methacrylic acid are dissolved in 95 parts of ethyl Cellosolve acetate. The solution is heated to about 60°–70° F and ethyl alcohol is added while stirring until the solution becomes cloudy. The stirring is continued and the solution is then allowed to cool to room temperature. Precipitate is removed by filtering. The solvents are stripped from the solution by gentle heating to about 60°–70° C. The residue from the solution is redissolved in ethyl Cellosolve to form 5% by weight solutions of the polymer. Films of 5,000 A copolymer thicknesses are formed on a number of different silicon wafers by spin casting the 5% solution at about 1,000 rpm. The films are prebaked in air at about 160° C for about 1 hour in an oven. The films are then exposed in vacuum of about $5\times10^{-6}$ mm of Hg, to x-rays with a wavelength $\lambda=8.3$ A at intensities of 0.01 joules/cm$^2$ using a 200 mesh copper grid as a mask. The exposed samples are soaked in 30 ml of a mixture containing 2 parts by volume of ethyl Cellosolve acetate per 5 parts by volume of ethyl alcohol for at least 5 minutes. Next the samples are subjected to ultrasonic agitation in at least 2 ml of an ethyl alcohol bath for 30 seconds to 1 minute. Clean developed lines of resist without any thickness loss in the unexposed regions are obtained.

COMPARISON EXAMPLE 7

Homopolymer of methyl methacrylate is dissolved in ethyl Cellosolve to form 5% by weight solutions. Films of 5,000 A homopolymer thicknesses are formed on a number of different silicon wafers by spin casting the 5% solutions at about 1,000 rpm. The films are prebaked in air at about 160° C for about ½ hour in an oven. The films are then exposed in vacuum of about $5\times10^{-6}$ mm of Hg to an electron beam of 1,000 A diameter pattern to produce lines of 1 micron and large areas of uniform exposure by use of a large mask in an optical flying spot scanner system. Exposures ranging from $10^{-6}$ coulombs/cm$^2$ to $10^{-5}$ coulombs/cm$^2$ are made on several examples.

Attempts to develop the exposed samples in 30 milliliters of a mixture containing 2 parts by volume of ethyl Cellosolve acetate per 5 parts by volume of ethyl alcohol followed by ultrasonic agitation in ethyl alcohol did not result in removal of the exposed areas. The exposed polymethyl methacrylate was not swelled in the swelling agent. Other combinations of solvents and nonsolvents such as methyl isobutyl ketone and isopropanol in various proportions also failed to produce selective swelling.

At exposures of about $10^{-5}$ coulombs/cm$^2$, the exposed areas were removed by using a methyl isobutyl ketone solvent. However, about ½ of the unexposed area was also removed with the methyl isobutyl ketone. Accordingly, the use of the low energy dosages as are applicable with the process of the present invention is not suitable for processing polymethyl methacrylate.

It was necessary to employ at least about $6\times10^{-5}$ coulombs/cm$^2$ exposure when using homopolymers of methyl methacrylate in order to develop the exposed areas without significant loss of thickness in the unexposed areas. However, it is still not possible to employ the swelling technique to remove polymethyl methacrylate exposed areas. Instead, the polymethyl methacrylate exposed areas are removed by molecularly dissolving in a solvent.

As demonstrated in the examples and as experienced by the present inventors, the prior art polymethyl methacrylate generally requires much greater dosage amounts and/or exposure times as compared to practicing the present invention. This is particularly important since the time involved in the preparation for instance of integrated circuits is primarily dependent upon the amount of time needed for the exposure step. The development step on the other hand of the present invention even though a two-step process is not significantly longer than prior art development steps and has the significant advantage of the relatively reduced exposure requirements.

What is claimed is:
1. Method for the production of a positive resist image comprising the steps of:
    A. exposing a film of a polymeric material to radiation in a predetermined pattern, wherein the polymeric material contains:
        1. polymerized alkyl methacrylate units wherein the alkyl group contains 1 to 4 carbon atoms; and
        2. polymerized units of a monoethylenically unsaturated acid selected from the group consisting of acrylic acid, methacrylic acid, crotonic acid, and mixtures thereof; and
    wherein the amount of the polymerized alkyl methacrylate unit (1) is from about 50 to about 99.5 mole % and the amount of the polymerized units of the monoethylenically unsaturated acid (2) is from about 50 to about 0.5 mole % based upon the total moles of (1) and 2. in the polymeric material;
    B. treating the polymeric material with a swelling agent to swell only the exposed portions; and
    C. then treating the polymeric film with a liquid which is incapable of molecularly dissolving the exposed or unexposed regions of the polymeric material for a time at least sufficient to remove the swollen exposed areas of the plymeric film.
2. The method of claim 1 wherein said radiation is electron beam radiation.
3. The method of claim 2 wherein said electron beam radiation is from about $10^{-7}$ coulombs/cm$^2$ to about $10^{-4}$ coulombs/cm$^2$ at an accelerating potential in the range from about 1 Kv to about 1 Mev.
4. The method of claim 1 wherein said radiation is x-ray radiation.
5. The method of claim 4 wherein said x-ray radiation is from about $5\times10^{-3}$ to about $5\times10^{-2}$ joules/cm$^2$ at a photon energy in the range from about 0.1 Kev to about 10 Kev.
6. The method of claim 1 wherein said radiation is ultraviolet light.
7. The method of claim 1 wherein said polymerized alkyl methacrylate units are polymerized methyl methacrylate, polymerized t-butyl methacrylate, or mixtures thereof.
8. The method of claim 1 wherein said polymerized alkyl methacrylate units include methyl methacrylate and said polymerized units of a monoethylenically unsaturated acid include methacrylic acid.
9. The method of claim 1 wherein the amount of the polymerized alkyl methacrylate unit (1) is from about 60 to about 95 mole % and the amount of the polymerized units of the monoethylenically unsaturated acid (2) is from about 5 to about 40 mole %.
10. The method of claim 1 wherein said swelling agent is a mixture of a solvent capable of dissolving the polymer and a nonsolvent liquid which is incapable of dissolving the polymer regardless of the molecular weight of the polymer mixed in proportions sufficient to swell only the exposed portions.
11. The method of claim 10 wherein the solvent capable of dissolving the polymeric material is a 2-alkoxyethanol or 2-alkoxyethyl ester or a cyclic ketone.
12. The method of claim 10 wherein said solvent capable of dissolving the polymeric material is selected from the group consisting of 2-methoxyethanol, 2-ethoxyethanol, 2-methoxyethyl acetate, 2-ethoxyethyl acetate, cyclopentanone, cyclohexanone, and cycloheptanone.

13. The method of claim 10 wherein the solvent capable of dissolving the polymeric material is 2-ethoxyethyl acetate.

14. The method of claim 10 wherein the solvent capable of dissolving the polymeric material is cyclopentanone.

15. The method of claim 10 wherein the nonsolvent is an aliphatic monohydric alcohol having from 1 to about 10 carbon atoms.

16. The method of claim 15 wherein said alcohol is selected from the group consisting of methyl alcohol, ethyl alcohol, isopropyl alcohol, N-butyl alcohol, t-butyl alcohol, and hexyl alcohol.

17. The method of claim 10 wherein said nonsolvent liquid is ethyl alcohol.

18. The method of claim 10 wherein said nonsolvent liquid is isopropyl alcohol.

19. The method of claim 10 wherein said solvent capable of dissolving the polymer is 2-ethoxyethyl acetate and said nonsolvent liquid is ethyl alcohol.

20. The method of claim 10 wherein said solvent capable of dissolving the polymer is cyclopentanone and said nonsolvent liquid is ethyl alcohol.

21. The method of claim 10 wherein said solvent capable of dissolving the polymer is cyclopentanone and said nonsolvent is isopropyl alcohol.

22. The method of claim 1 wherein the swollen areas of the polymeric film are removed by employing ultrasonic agitation for about 15 to about 90 seconds.

23. The method of claim 1 wherein the film is prebaked prior to exposing the film to radiation.

24. The method of claim 23 wherein said film is prebaked at a temperature from about 140° to about 230° C.

25. The method of claim 23 wherein the film is prebaked at a temperature from about 160° to about 220° C.

26. The method of claim 1 wherein the polymeric film is treated with the swelling agent for about 1 to about 90 minutes.

27. The method of claim 1 wherein the polymeric film is treated with the swelling agent from about 3 to about 60 minutes.

28. The method of claim 1 wherein subsequent to the removal of the swollen exposed areas of a film, the polymeric film is postbaked to remove developer liquids.

29. The method of claim 28 wherein the postbaking is carried out at a temperature between about 100° to about 170° C.

* * * * *

UNITED STATES PATENT AND TRADEMARK OFFICE
CERTIFICATE OF CORRECTION

PATENT NO. : 3,984,582
DATED : October 5, 1976
INVENTOR(S) : Ralph Feder et al

It is certified that error appears in the above-identified patent and that said Letters Patent are hereby corrected as shown below:

In the Heading, please correct the name of the assignee to:
-- International Business Machines Corporation,
   Armonk, New York --

Column 4, line 10, delete "but below the ther-".

Column 4, line 11, delete "mal temperature of the polymeric material".

Column 4, line 38, change "(nonsolvent)" to -- ("nonsolvent") --.

Column 4, line 47, change "Cellosive" to -- Cellosolve --.

Column 4, line 56, change "form" to -- from --.

Column 5, line 25, change "developement" to -- development --.

Column 5, line 27, change "to" to -- and --.

Column 5, line 58, after "polymerized" insert -- alkyl methacrylate units wherein the alkyl group contains from 1 to 4 carbon atoms; and polymerized --.

Column 5, line 63, insert the sentence -- Mixtures of the alkyl methacrylates can be employed if desired. --.

Column 6, line 26, delete "the" (second occurrence).

UNITED STATES PATENT AND TRADEMARK OFFICE
CERTIFICATE OF CORRECTION

PATENT NO. : 3,984,582
DATED : October 5, 1976
INVENTOR(S) : Ralph Feder et al

It is certified that error appears in the above-identified patent and that said Letters Patent are hereby corrected as shown below:

Column 6, line 34, change "(Mn)" to -- ($\overline{Mn}$) --.

Column 6, line 40, after "azo" insert -- type --.

Column 6, line 59, change "fractioned" to -- fractionated --.

Column 7, line 43, insert quotation marks around "lift-off".

Column 7, line 46, change "cellosolve" to -- Cellosolve --.

Column 8, line 17, after "coulombs/cm$^2$" (first occurrence) insert -- to 4x10$^{-6}$ --.

Column 8, line 35, change "misture" to -- mixture --.

Column 9, line 38, change "and" to -- are --.

Claim 1, line 21, change "2." to -- (2) --. Claim 1, line 21 should not be indented.

Claim 1, line 24, change "plymeric" to -- polymeric --.

Signed and Sealed this

Twenty-sixth Day of April 1977

[SEAL]

Attest:

RUTH C. MASON
*Attesting Officer*

C. MARSHALL DANN
*Commissioner of Patents and Trademarks*